(12) United States Patent
Kusakabe

(10) Patent No.: US 6,271,546 B1
(45) Date of Patent: Aug. 7, 2001

(54) SEMICONDUCTOR PHOTODETECTOR WITH AN INCREASED PHOTO RECEIVING AREA AND EXHIBITING HIGH SPEED PERFORMANCES

(75) Inventor: Atsuhiko Kusakabe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/333,886

(22) Filed: Jun. 15, 1999

(30) Foreign Application Priority Data

Jun. 15, 1998 (JP) .................................................. 10-166676

(51) Int. Cl.$^7$ ....................... H01L 31/072; H01L 31/109; H01L 31/0328; H01L 31/0336

(52) U.S. Cl. .......................... 257/184; 257/185; 257/436; 359/248; 438/94

(58) Field of Search ................................... 257/184, 185, 257/436; 359/248; 438/94

(56) References Cited

U.S. PATENT DOCUMENTS

| 5,637,883 | * | 6/1997 | Bowman et al. | 257/21 |
| 5,818,066 | * | 10/1998 | Duboz | 257/21 |
| 6,075,254 | * | 6/2000 | Shen et al. | 257/21 |

FOREIGN PATENT DOCUMENTS

| 0 370 830 | 5/1990 | (EP) . |
| 61-030085 | 2/1986 | (JP) . |
| 63-030821 | 2/1988 | (JP) . |
| 4-268770 | 9/1992 | (JP) . |
| 10-090540 | 4/1998 | (JP) . |

* cited by examiner

*Primary Examiner*—William Mintel
(74) *Attorney, Agent, or Firm*—Young & Thompson

(57) ABSTRACT

A compound semiconductor multilayer structure includes a plurality of core layers absorbing light and exhibiting a photoelectric transfer; and a plurality of cladding layers, adjacent two of which sandwich each of the core layers so that the core layers are separated from each other by the cladding layers.

17 Claims, 3 Drawing Sheets

Waveguide portion

SEMICONDUCTOR PHOTODETECTOR WITH AN INCREASED PHOTO RECEIVING AREA AND EXHIBITING HIGH SPEED PERFORMANCES

BACKGROUND OF THE INVENTION

The present invention relates to a semiconductor photodetector, and more particularly to a semiconductor photodetector with an increased photo receiving area and exhibiting high speed performances.

Semiconductor waveguide photodetectors have been known as one kind of the photodetectors in the art to which the present invention pertains. One of the conventional semiconductor waveguide photodetectors is disclosed in Japanese laid-open patent publication No 4-268770. FIG. 1 is a schematic perspective view illustrative of the conventional semiconductor waveguide photodetector. The structure of the conventional semiconductor waveguide photodetector. A semiconductor substrate, on which the conventional semiconductor waveguide photodetector is formed, comprises an n$^+$-InP substrate 11 having a carrier concentration of $1\times10^{18}$ cm$^{-3}$. A bottom cladding layer 12 is provided on a top surface of the n$^+$-InP substrate 11, wherein the bottom cladding layer 12 comprises an n$^+$-In$_{1-x}$Ga$_x$As$_y$P$_{1-y}$ (x=0.33, y=0.7) bottom cladding layer 12 having a carrier concentration of $1\times10^{18}$ cm$^{-3}$ and a thickness of 2 micrometers as well as having a band gap wavelength of 1.37 micrometers. A core layer 13 is provided on a top surface of the n$^+$-In$_{1-x}$Ga$_x$As$_y$P$_{1-y}$ (x=0.33, y=0.7) bottom cladding layer 12, wherein the core layer 13 comprises an n$^+$-In$_{1-x}$Ga$_x$As$_y$P$_{1-y}$ (x=0.35, y=0.76) core layer 13 having a carrier concentration of $1\times10^{18}$ cm$^{-3}$ and a thickness of 0.1 micrometer as well as having a band gap wavelength of 1.42 micrometers. A top cladding layer is provided on the n$^+$-In$_{1-x}$Ga$_x$As$_y$P$_{1-y}$ (x=0.35, y=0.76) core layer 13. The top cladding layer comprises a first top cladding layer 14 extending on an entire surface of the n$^+$-In$_{1-x}$Ga$_x$As$_y$P$_{1-y}$ (x=0.35, y=0.76) core layer 13, a second top cladding layer 15 selectively extending on a predetermined region of a top surface of the first top cladding layer 14, and a third top cladding layer 16 extending on an entire surface of the second top cladding layer 15, so that the second and third top cladding layers 15 and 16 form a ridged portion. The laminations of the first and second top cladding layers 14 and 15 comprise 20 periods of alternating laminations of undoped n$^+$-In$_{1-x}$Ga$_x$As$_y$P$_{1-y}$ (x=0.42, y=0.9) layers having a thickness of 0.005 micrometers and having a band gap wavelength of 1.57 micrometers and undoped In$_{1-x}$Ga$_x$As$_y$P$_{1-y}$ (x=0.33, y=0.7) layers having a thickness of 0.01 micrometers and having a band gap wavelength of 1.29 micrometers. The third top cladding layer 16 comprises a p$^+$-In$_{1-x}$Ga$_x$As$_y$P$_{1-y}$ (x=0.33, y=0.7) layer having a thickness of 2 micrometers and a carrer concentration of $1\times10^{18}$ cm$^{-3}$. An n-electrode 17 is provided on an entire bottom surface of the n+-InP substrate 11. A p-electrode 18 is provided on an entire bottom surface of the third top cladding layer 16. The laminations of the n+-InP substrate 11, the n$^+$-In$_{1-x}$Ga$_x$As$_y$P$_{1-y}$ (x=0.33, y=0.7) bottom cladding layer 12, and the n$^+$-In$_{1-x}$Ga$_x$As$_y$P$_{1-y}$ (x=0.35, y=0.76) core layer 13 are in the form of an n-electrode side region. The laminations of the first and second top cladding layers 14 and 15 are in the form of a low carrier concentration intermediate region. The third top cladding layer 16 is in the form of a p-electrode side region. The above undoped In$_{1-x}$Ga$_x$As$_y$P$_{1-y}$ (x=0.42, y=0.9) layers of 0.005 micrometers in thickness and of 1.57 micrometers in band gap wavelength but only in the second top cladding layer 15 in the ridged portion are capable of absorbing a light having a wavelength of 1.55 micrometers to cause a photoelectric transfer. The light having the wavelength of 1.55 micrometers can be absorbed by only the undoped In$_{1-x}$Ga$_x$As$_y$P$_{1-y}$ (x=0.42, y=0.9) layers. This means that the photo receiving area of the above conventional device is small and thus a coupling efficiency of the photodetector is low.

In the above circumstances, it had been required to develop a novel semiconductor photodetector free from the above problems.

SUMMARY OF THE INVENTION

Accordingly, it is an object of the present invention to provide a novel semiconductor photodetector free from the above problems.

It is a further object of the present invention to provide a novel semiconductor photodetector having an increased effective photo receiving area.

It is a still further object of the present invention to provide a novel semiconductor photodetector designed to shorten a distance of travel of carriers generated by a photoelectric transfer.

It is yet a further object of the present invention to provide a novel semiconductor photodetector exhibiting improved high speed performances.

It is a further more object of the present invention to provide a novel semiconductor photodetector driven by a low driving voltage.

The present invention provides a compound semiconductor multilayer structure comprising: a plurality of core layers absorbing a light and exhibiting a photoelectric transfer and a plurality of cladding layers, adjacent two of which sandwich each of the core layers so that the core layers are separated from each other by the cladding layers.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
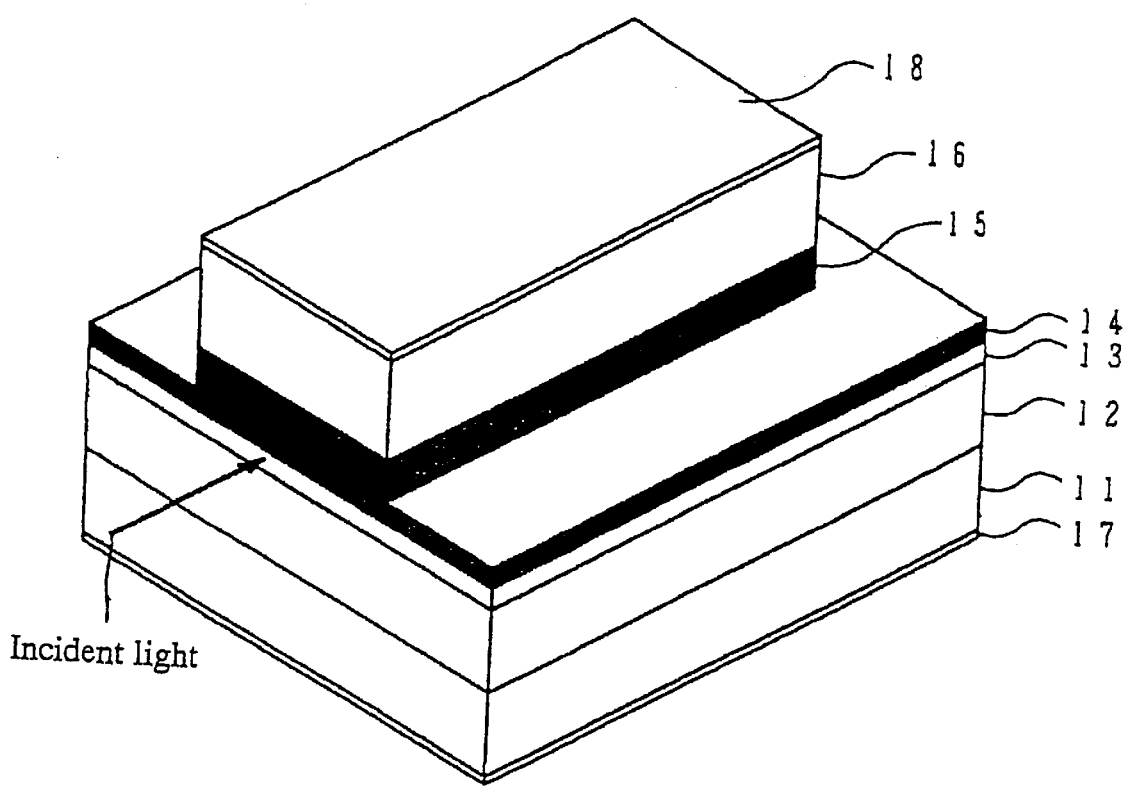
FIG. 1 is a schematic perspective view illustrative of the conventional semiconductor waveguide photodetector.

The first present invention provides a compound semiconductor multilayer structure compnsing: a plurality of core layers absorbing a light and exhibiting a photoelectric transfer; and a plurality of cladding layers, adjacent two of which sandwich each of the core layers so that the core layers are separated from each other by the cladding layers. A sandwiching structure of the cladding layers sandwiching the core layer forms a photoelectric transfer structure. Light is received incident to an edged surface of a lamination structure of the core layers and the cladding layers, so that the provision of the plural core layers absorbing the light and exhibiting the photoelectric transfer or the provision of the plural photoelectric transfer structures increase the effective photo receiving area of the above structure, whereby the coupling efficiency of the photodetector is improved. Further, the plural core layers allow a reduction in thickness of individual core layers. This reduction in thickness of the individual core layers allows a reduction in the necessary voltage for forming a depletion region or a space charge region, whereby a driving voltage is also reduced.

It is preferable that adjacent two of the cladding layers, which sandwich each of the core layers, are of first and second conductivity types respectively so that first conductivity type carriers generated by the photoelectric transfer move into a first conductivity type one of the cladding layers while the second conductivity type carriers generated by the photoelectric transfer move into a second conductivity type one of the cladding layers. Namely, the first and second conductivity type carriers generated in each of the core layers are moved into the adjacent first and second conductivity type cladding layers sandwiching the each core layer, whereby the distance of travel of the first and second conductivity type carriers are shortened. This means it possible to allow the semiconductor photodetector having the above novel multilayer structure to exhibit improved high speed performances.

It is further preferable that the cladding layers comprise InP of first and second conductivity types whilst the core layers comprise intrinsic InGaAs.

It is also preferable that the cladding layers comprise InP layers of first and second conductivity types whilst the core layers comprise InGaAs layers of the first conductivity type having a lower impurity concentration than the InP layers of the first conductivity type.

It is also preferable that the first conductivity type cladding layers extend from and are unitary formed with a first conductivity type cladding bulk region which extends in a vertical direction to interfaces between the core layers and the cladding layers, and the first conductivity type cladding bulk region is positioned in a first side of a laminated structure of the core layers and the cladding layers, and the first conductivity type cladding bulk region is made of the same compound semiconductor as the first conductivity type cladding layers as well as preferable that the second conductivity type cladding layers extend from and are unitary formed with a second conductivity type cladding bulk region which extends in the vertical direction to the interfaces between the core layers and the cladding layers, and the second conductivity type cladding bulk region is positioned in a second side of the laminated structure of the core layers and the cladding layers, and the second conductivity type cladding bulk region is made of the same compound semiconductor as the second conductivity type cladding layers.

It is also preferable that each of the core layers consists entirely of a light absorption layer absorbing the light and exhibiting the photoelectric transfer.

The above novel compound semiconductor multilayer structure is applicable to a compound semiconductor photodetector comprising: a compound semiconductor substrate ; and the compound semiconductor multilayer structure formed on the compound semiconductor substrate.

A light is incident into an edged surface of the above lamination structure of the cladding layers and the core layers, so that the incident light from the edged surface is absorbed into the plural core layers. The absorption of the incident light into the core layers causes a photoelectric transfer in the plural core layers, whereby first conductivity type and second conductivity type carriers, for example, electrons and holes are generated in the core layers. An electric field is applied across each of the core layers, whereby the generated electrons and holes are forced to move toward the adjacent first conductivity type cladding layer and the adjacent second conductivity type cladding layer respectively.

The provision of the plural core layers absorbing the light and exhibiting the photoelectric transfer or the provision of the plural photoelectric transfer structures results in increase in the effective photo receiving area of the above structure, whereby the coupling efficiency of the photodetector is improved.

Further, the first and second conductivity type carriers, for example, electrons and holes generated in each of the plural core layers are forced to move into the adjacent first conductivity type cladding layer and the adjacent second conductivity type cladding layer respectively, whereby the distance of travel of the first and second conductivity type carriers, for example, electrons and holes are shortened. This means it possible to allow the semiconductor photodetector having the above novel multilayet structure to exhibit improved high speed performances.

Furthermore, the plural core layers are reduced in thickness and further each of the core layers is sandwiched between the adjacent first conductivity type cladding layer and the adjacent second conductivity type cladding layer. Those structures allow a reduction in the necessary voltage for forming a depletion region or a space charge region, whereby the necessary driving voltage is also reduced.

The second present invention provides a compound semiconductor multilayer structure comprising: plural laminations of a photoelectric transfer structure which comprises a core layer absorbing a light and exhibiting a photoelectric transfer and cladding layers sandwiching the core layer, so that the core layers are separated from each other by the cladding layers. A sandwiching structure of the cladding layers sandwiching the core layer forms a photoelectric transfer structure. A light is incident into an edged surface of a lamination structure of the core layers and the cladding layers, so that the provision of the plural core layers absorbing the light and exhibiting the photoelectric transfer or the provision of the plural photoelectric transfer structures in increase in the effective photo receiving area of the above structure, whereby the coupling efficiency of the photodetector is improved. Further, the plural core layers allow reduction in thickness of individual core layers. This reduction in thickness of the individual core layers allows a reduction in the necessary voltage for forming a depletion region or a space charge region, whereby a driving voltage is also reduced.

It is preferable that adjacent two of the cladding layers, which sandwich each of the core layers, are of first and second conductivity types respectively so that first conductivity type carriers generated by the photoelectric transfer move into a first conductivity type one of the cladding layers while the second conductivity type carriers generated by the photoelectric transfer move into a second conductivity type one of the cladding layers. Namely, the first and second conductivity type carriers generated in each of the core layers are moved into the adjacent first and second conductivity type cladding layers sandwiching the each core layer, whereby the distance of travel of the first and second conductivity type carriers are shortened. This means it possible to allow the semiconductor photodetector having the above novel multilayer structure to exhibit improved high speed performances.

It is further preferable that the cladding layers comprise InP of first and second conductivity types whilst the core layers comprise intrinsic InGaAs.

It is also preferable that the cladding layers comprise InP layers of first and second conductivity types whilst the core layers comprise InGaAs layers of the first conductivity type having a lower impurity concentration than the InP layers of the first conductivity type.

It is also preferable that the first conductivity type cladding layers extend from and are unitary formed with a first conductivity type cladding bulk region which extends in a vertical direction to interfaces between the core layers and the cladding layers, and the first conductivity type cladding bulk region is positioned in a first side of a laminated structure of the core layers and the cladding layers, and the first conductivity type cladding bulk region is made of the same compound semiconductor as the first conductivity type cladding layers as well as wherein the second conductivity type cladding layers extend from and are unitary formed with a second conductivity type cladding bulk region which extends in the vertical direction to the interfaces between the core layers and the cladding layers, and the second conductivity type cladding bulk region is positioned in a second side of the laminated structure of the core layers and the cladding layers, and the second conductivity type cladding bulk region is made of the same compound semiconductor as the second conductivity type cladding layers.

It is also preferable that each of the core layers consists entirely of a light absorption layer absorbing the light and exhibiting the photoelectric transfer.

The above second present invention is applicable to a compound semiconductor photodetector comprising a compound semiconductor substrate; and the compound semiconductor multilayer structure formed on the compound semiconductor substrate.

A light is incident into an edged surface of the above lamination structure of the cladding layers and the core layers, so that the incident light from the edged surface is absorbed into the plural core layers. The absorption of the incident light into the core layers causes a photoelectric transfer in the plural core layers, whereby first conductivity type and second conductivity type carriers, for example, electrons and holes are generated in the core layers. An electric field is applied across each of the core layers, whereby the generated electrons and holes are forced to move toward the adjacent first conductivity type cladding layer and the adjacent second conductivity type cladding layer respectively.

The provision of the plural core layers absorbing the light and exhibiting the photoelectric transfer or the provision of the plural photoelectric transfer structures results in increase in the effective photo receiving area of the above structure, whereby the coupling efficiency of the photodetector is improved.

Further, the first and second conductivity type carriers, for example, electrons and holes generated in each of the plural core layers are forced to move into the adjacent first conductivity type cladding layer and the adjacent second conductivity type cladding layer respectively, whereby the distance of travel of the first and second conductivity type carriers, for example, electrons and holes is shortened. This means it possible to allow the semiconductor photodetector having the above novel multilayer structure to exhibit improved high speed performances.

Furthermore, the plural core layers are reduced in thickness and further each of the core layers is sandwiched between the adjacent first conductivity type cladding layer and the adjacent second conductivity type cladding layer. Those structures allow a reduction in the necessary voltage for forming a depletion region or a space charge region, whereby the necessary driving voltage is also reduced.

The third present invention provides a compound semiconductor photodetector comprising: a compound semiconductor substrate; alternating laminations of a plurality of core layers absorbing a light and exhibiting a photoelectric transfer and a plurality of cladding layers; a first conductivity type cladding bulk region; a second conductivity type cladding bulk region; a first electrode in contact with the first conductivity type cladding bulk region; and a second electrode in contact with the second conductivity type cladding bulk region. Adjacent two of the cladding layers sandwich each of the core layers so that the core layers are separated from each other by the cladding layers. The adjacent two of the cladding layers, which sandwich each of the core layers, are of first and second conductivity types respectively so that first conductivity type carriers generated by the photoelectric transfer move into a first conductivity type one of the cladding layers whilst second conductivity type carriers generated by the photoelectric transfer move into a second conductivity type one of the cladding layers. The first conductivity type cladding layers extend from the first conductivity type cladding bulk region. The first conductivity type cladding bulk region is unitary formed with the first conductivity type cladding layers. The first conductivity type cladding bulk region extends in a vertical direction to interfaces between the core layers and the cladding layers. The first conductivity type cladding bulk region is positioned in a first side of the alternating laminations of the core layers and the cladding layers. The first conductivity type cladding bulk region is made of the same compound semiconductor as the first conductivity type cladding layers. The second conductivity type cladding layers extend from the second conductivity type cladding bulk region. The second conductivity type cladding bulk region is unitary formed with the second conductivity type cladding layers. The second conductivity type cladding bulk region extends in the vertical direction to the interfaces between the core layers and the cladding layers. The second conductivity type cladding bulk region is positioned in a second side of the alternating laminations of the core layers and the cladding layers. The second conductivity type cladding bulk region is made of the same compound semiconductor as the second conductivity type cladding layers. A sandwiching structure of the cladding layers sandwiching the core layer forms a photoelectric transfer structure. A light is incident into an edged surface of a lamination structure of the core layers and the cladding layers, so that the provision of the plural core layers absorbing the light and exhibiting the photoelectric transfer or the provision of the plural photoelectric transfer structures results in increase in the effective photo receiving area of the above structure, whereby the coupling efficiency of the photodetector is improved. Further, the first and second conductivity type carriers generated in each of the core layers are moved into the adjacent first and second conductivity type cladding layers sandwiching the each core layer, whereby the distance of travel of the first and second conductivity type carriers are shortened. This means it possible to allow the semiconductor photodetector having the above novel multilayer structure to exhibit improved high speed performances. Furthermore, the plural core layers allow reduction in thickness of individual core layers.

This reduction in thickness of the individual core layers allows a reduction in the necessary voltage for forming a depletion region or a space charge region, whereby a driving voltage is also reduced.

It is preferable that the first and second conductivity type cladding layers and bulk regions comprise InP whilst the core layers comprise intrinsic InGaAs.

It is also preferable that the first and second conductivity type cladding layers and bulk regions comprise InP whilst the core layers comprise InGaAs layers of the first conductivity type having a lower impurity concentration than the InP layers of the first conductivity type.

It is also preferable that each of the core layers consists entirely of a light absorption layer absorbing the light and exhibiting the photoelectric transfer.

Light is received incident to an edged surface of the above lamination structure of the cladding layers and the core layers so that the incident light from the edged surface is absorbed into the plural core layers. The absorption of the incident light into the core layers causes a photoelectric transfer in the plural core layers, whereby first conductivity type and second conductivity type carriers, for example, electrons and holes are generated in the core layers. An electric field is applied across each of the core layers, whereby the generated electrons and holes are forced to move toward the adjacent first conductivity type cladding layer and the adjacent second conductivity type cladding layer respectively.

The provision of the plural core layers absorbing the light and exhibiting the photoelectric transfer or the provision of the plural photoelectric transfer structures results in increase in the effective photo receiving area of the above structure, whereby the coupling efficiency of the photodetector is improved.

Further, the first and second conductivity type carriers, for example, electrons and holes generated in each of the plural core layers are forced to move into the adjacent first conductivity type cladding layer and the adjacent second conductivity type cladding layer respectively, whereby the distance of travel of the first and second conductivity type carriers, for example, electrons and holes are shortened. This means it possible to allow the semiconductor photodetector having the above novel multilayer structure to exhibit improved high speed performances.

Furthermore, the plural core layers are reduced in thickness and further each of the core layers is sandwiched between the adjacent first conductivity type cladding layer and the adjacent second conductivity type cladding layer. Those structures allow a reduction in the necessary voltage for forming a depletion region or a space charge region, whereby the necessary driving voltage is also reduced.

Figure 2:
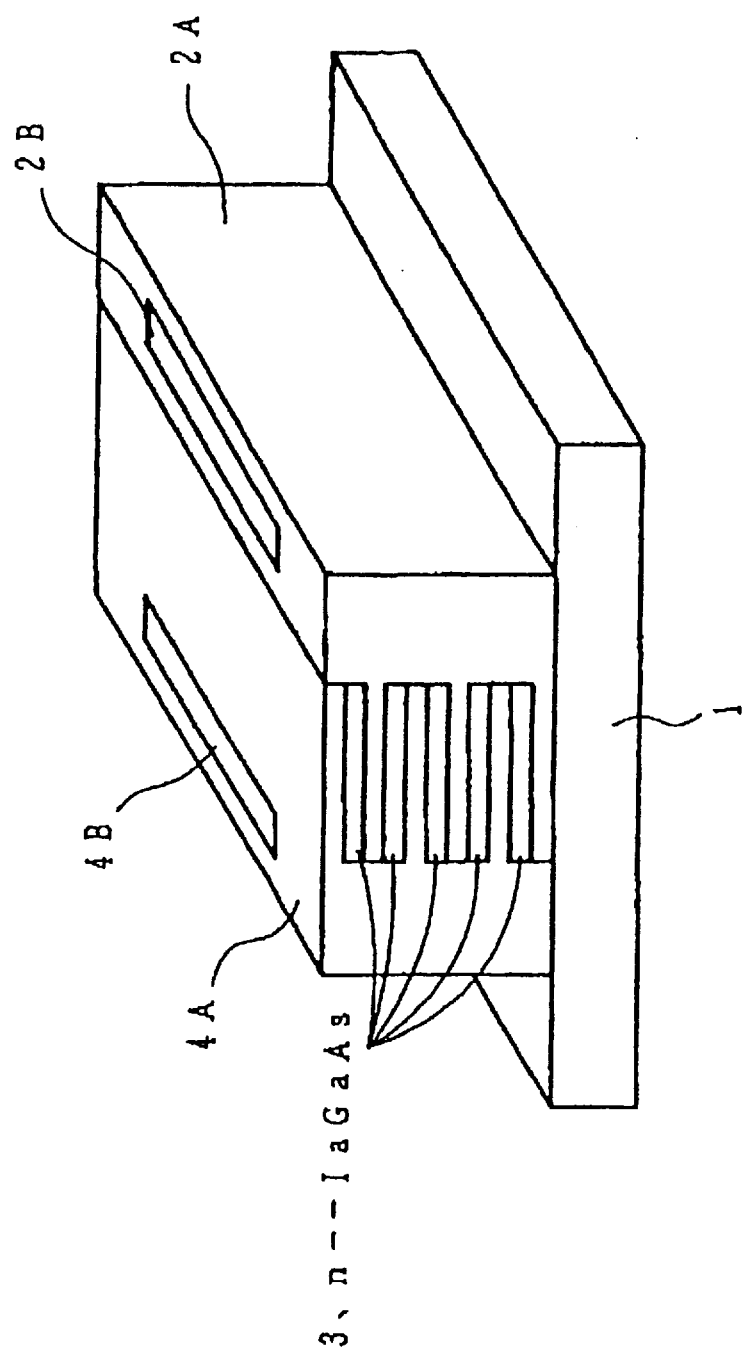
FIG. 2 is a schematic perspective view illustrative of a novel compound semiconductor photodetector with an increased photo receiving area and exhibiting improved high speed performances in a first embodiment in accordance with the present invention.
Figure 3:
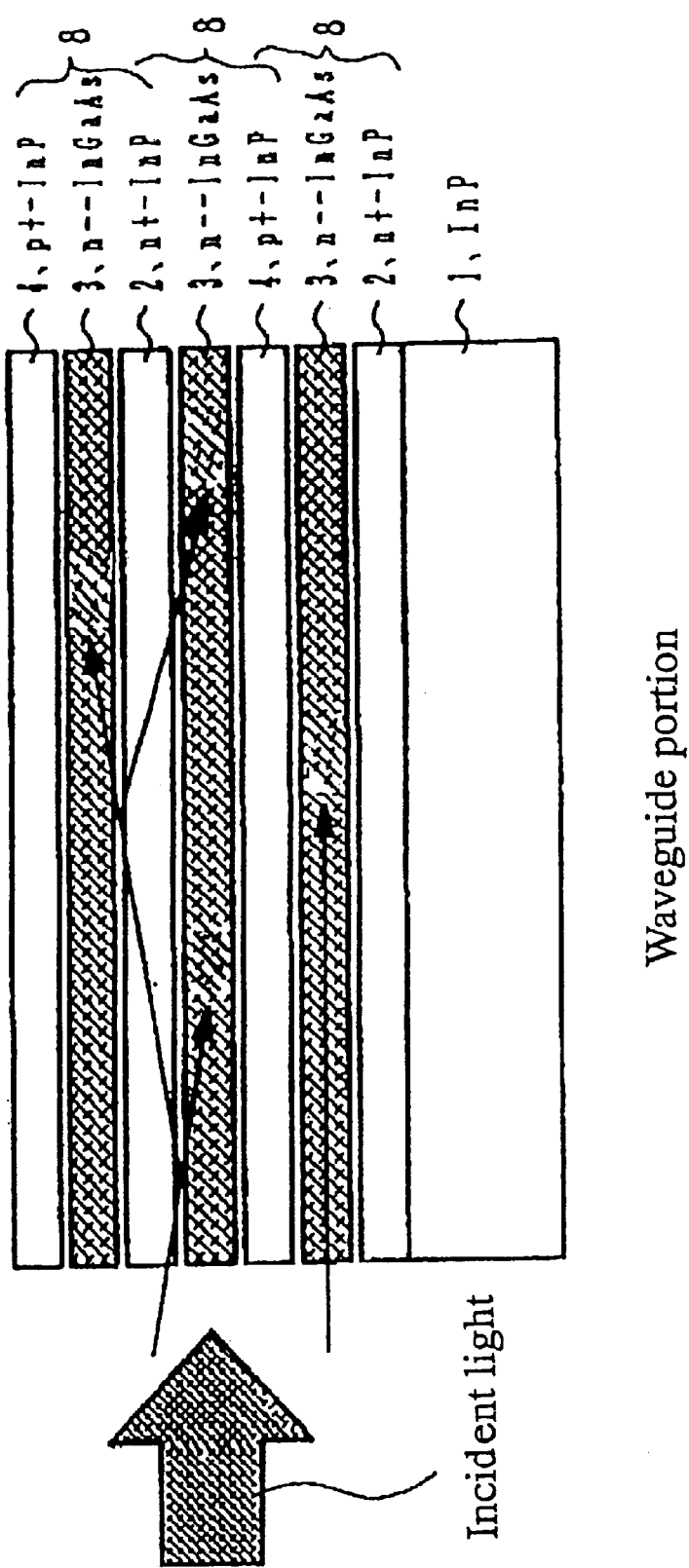
FIG. 3 is a fragmentary cross sectional elevation view illustrative of a waveguide portion of a novel compound semiconductor photodetector of FIG. 2.

A first embodiment according to the present invention will be described in detail with reference to the drawings. FIG. 2 is a schematic perspective view illustrative of a novel compound semiconductor photodetector with an increased photo receiving area and exhibiting improved high speed performances in a first embodiment in accordance with the present invention. FIG. 3 is a fragmentary cross sectional elevation view illustrative of a waveguide portion of a novel compound semiconductor photodetector of FIG. 2.

A compound semiconductor photodetector is formed over a semiinsulating InP semiconductor substrate 1. A waveguide stripe-shaped ridged portion is provided on a predetermined region of a top surface of a semiconductor substrate 1. The waveguide stripe-shaped ridged portion comprises alternating laminations of a plurality of core layers absorbing light and exhibiting a photoelectric transfer and a plurality of cladding layers, a first conductivity type cladding bulk region 2A, and a second conductivity type cladding bulk region 4A. A first stripe-shaped electrode 2B is provided on a predetermined region of a top surface of the first conductivity type cladding bulk region 2A. A second stripe-shaped electrode 4B is provided on a predetermined region of a top surface of the second conductivity type cladding bulk region 4A. Adjacent two of the cladding layers 2 and 4 sandwich each of the core layers 3 so that the core layers 3 are separated from each other by the cladding layers 2 and 4. The adjacent two of the cladding layers 2 and 4, which sandwich each of the core layers 3, are of first and second conductivity types respectively so that first conductivity type carriers generated by the photoelectric transfer move into a first conductivity type one of the cladding layers 2 and 4 whilst second conductivity type carriers generated by the photoelectric transfer move into a second conductivity type one of the cladding layers 2 and 4.

Each of the first conductivity type cladding layers 2 may comprise an $n^+$-InP cladding layer having a thickness of 0.1 micrometer and an impurity concentration of 1E16 $cm^{-3}$. Each of the second conductivity type cladding layers 4 may comprise a $p^+$-InP cladding layer having a thickness of 0.1 micrometer and an impurity concentration of 1E16 $cm^{-3}$. The first conductivity type cladding bulk region 2A may comprise an $n^+$-InP bulk region having an impurity concentration of 1E16 $cm^{-3}$. The second conductivity type cladding bulk region 4A may comprise a $p^+$-InP bulk region having an impurity concentration of 1E16 $cm^{-3}$. Each of the core layers 3 may comprise an $n^-$-InGaAs optical absorption layer 3 having a thickness of 0.2 micrometer and an impurity concentration of 1E15 $cm^{-3}$. The alternating lamination structure of the core layer 3 and the first and second conductivity type cladding layers 2 and 4 may, for example, form as follows. A first level $n^+$-InP cladding layer 2 is provided on a predetermined stripe-shaped region of the top surface of the sermi-insulating InP substrate 1. A first level $n^-$-InGaAs optical absorption layer 3 is laminated on the first level $n^+$-InP cladding layer 2. A first level $p^+$-InP cladding layer 4 is laminated on the first $n^-$-InGaAs optical absorption layer 3. Laminations of the first level $n^+$-InP cladding layer 2, the first level $n^-$-InGaAs optical absorption layer 3, and the first level $p^+$-InP cladding layer 4 forms a first level photoelectric transfer structure 8. Further, a second level $n^-$-InGaAs optical absorption layer 3 is laminated on the first level $p^+$-InP cladding layer 4. A second level $n^+$-InP cladding layer 2 is laminated on the second level $n^-$-InGaAs optical absorption layer 3. Laminations of the first level $p^+$-InP cladding layer 4, the second level $n^{31}$-InGaAs optical absorption layer 3, and the second level $n^+$-InP cladding layer 2 forms a second level photoelectric transfer structure 8. Furthermore, a third level $n^-$-InGaAs optical absorption layer 3 is laminated on the second level $n^+$-InP cladding layer 2. A third level $p^+$-InP cladding layer 4 is laminated on the third level $n^-$-InGaAs optical absorption layer 3. Laminations of the second level $n^+$-InP cladding layer 2, the third level $n^-$-InGaAs optical absorption layer 3 and the third level $p^+$-InP cladding layer 4 forms a third level photoelectric transfer structure 8. Those photoelectric transfer structures 8 are repeated so as to laminate five $n^-$-InGaAs optical absorption layers 3 as the core layers. Those lamination structures may be formed by epitaxial growths.

The $n^+$-InP cladding layers 2 as the first conductivity type cladding layers extend from the $n^+$-InP cladding bulk region 2A as the first conductivity type cladding bulk region. The $n^+$-InP cladding bulk region 2A as the first conductivity type cladding bulk region is unitary formed with the n⁺-InP cladding layers 2 as the first conductivity type cladding layers. The n⁺-InP cladding bulk region 2A as the first conductivity type cladding bulk region extends in a vertical direction to interfaces of the n⁺-InP cladding layer 2, the n⁻-InGaAs optical absorption layer 3 and the p⁺-InP cladding layer 4. The n⁺-InP cladding bulk region 2A as the first conductivity type cladding bulk region is positioned in a first side of the above alternating lamination structure of the core layers and the cladding layers. The n⁺-InP cladding bulk region 2A as the first conductivity type cladding bulk region is made of the same compound semiconductor as the n⁺-InP cladding layers 2.

The p⁺-InP cladding layer 4 as the second conductivity type cladding layers extend from the p⁺-InP cladding bulk region 4A as the second conductivity type cladding bulk region. The p⁺-InP cladding bulk region 4A as the second conductivity type cladding bulk region is unitary formed with the p⁺-InP cladding layer 4 as the second conductivity type cladding layers. The p⁺-InP cladding bulk region 4A as the second conductivity type cladding bulk region extends in the vertical direction to the interfaces of the n⁺-InP cladding layer 2, the n⁻-InGaAs optical absorption layer 3 and the p⁺-InP cladding layer 4. The p⁺-InP cladding bulk region 4A as the second conductivity type cladding bulk region is positioned in a second side of the above alternating lamination structure. The p⁺-InP cladding bulk region 4A as the second conductivity type cladding bulk region is made of the same compound semiconductor as the p⁺-InP cladding layer 4 as the second conductivity type cladding layers.

Namely, the stripe-shaped ridged structure comprises five periods of the photoelectric transfer structures 8. The stripe-shaped ridged structure has a width of 15 micrometers. The stripe-shaped ridged structure may be formed by a selective etching technique. After the stripe-shaped ridged structure has been formed, then opposite recessed portions of the stripe-shaped ridged structure are then filled with the n⁺-InP cladding bulk regions 2A. Zn is introduced and diffused into one of the n⁺-InP cladding bulk regions 2A so that the p⁺-InP cladding bulk region 4A is formed in one side of the stripe-shaped ridged structure. The electrodes 2B and 4B are then formed on top surfaces of the n⁺-InP cladding bulk regions 2A and the p⁺-InP cladding bulk region 4A respectively.

A light having a wavelength of 1.3 micrometers or 1.55 micrometers is incident into an edged surface of the above lamination structure of the n⁺-InP cladding layer 2, the n⁻-InGaAs optical absorption layer 3 and the p⁺-InP cladding layer 4, so that the incident light from the edged surface is absorbed into the plural n⁻-InGaAs optical absorption layer 3 as the core layers. The absorption of the incident light into the plural n⁻-InGaAs optical absorption layers 3 as the core layers causes a photoelectric transfer in the plural n⁻-InGaAs optical absorption layers 3 as the core layers, whereby carriers, for example, electrons and holes are generated plural n⁻-InGaAs optical absorption layers 3 as the core layers. Since the electrodes 2B and 4B are applied with a voltage, an electric field is applied across each of the plural n⁻-InGaAs optical absorption layers 3, whereby the generated electrons and holes are forced to move toward the adjacent n⁺-InP cladding layer 2 as the first conductivity type cladding layer and the adjacent p⁺-InP cladding layer 4 as the second conductivity type cladding layer respectively.

The provision of the plural n⁻-InGaAs optical absorption layers 3 as the core layers absorbing the light and exhibiting the photoelectric transfer or the provision of the plural photoelectric transfer structures 8 results in increase in the effective photo receiving area of the above structure up to, for example, 3 micrometers, whereby the coupling efficiency of the photodetector is improved to not less than 90%.

Further, the first and second conductivity type carriers, for example, electrons and holes generated in each of the plural n⁻-InGaAs optical absorption layers 3 as the core layers are forced to move into the adjacent n⁺-InP cladding layer 2 as the first conductivity type cladding layer and the adjacent p⁺-InP cladding layer 4 as the second conductivity type cladding layer respectively, whereby the distance of travel of the first and second conductivity type carriers, for example, electrons and holes are shortened. This means it possible to allow the semiconductor photodetector having the above novel multilayer structure to exhibit improved high speed performances up to not less than 20 GHz.

Furthermore, the plural n⁻-InGaAs optical absorption layers 3 as the core layers are reduced in thickness and further each of the plural n⁻-InGaAs optical absorption layers 3 as the core layers is sandwiched between the adjacent n⁺-InP cladding layer 2 as the first conductivity type cladding layer and the adjacent p⁺-InP cladding layer 4 as the second conductivity type cladding layer. Those structures allow a reduction in the necessary voltage for forming a depletion region or a space charge region into not high than 1V, whereby the necessary driving voltage is also reduced.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A compound semiconductor multilayer structure comprising:

a plurality of core layers absorbing light and exhibiting a photoelectric transfer;

a plurality of cladding layers, adjacent two of which sandwich each of said core layers so that said core layers are separated from each other by said cladding layers, wherein adjacent two of said cladding layers, which sandwich each of said core layers, are of first and second conductivity types respectively so that first conductivity type carriers generated by said photoelectric transfer move into a first conductivity type one of said cladding layers and second conductivity type carriers generated by said photoelectric transfer move into a second conductivity type one of said cladding layers.

2. The semiconductor multilayer structure as claimed in claim 2, wherein said cladding layers comprise InP of first and second conductivity types respectively and said core layers comprise intrinsic InGaAs.

3. The semiconductor multilayer structure as claimed in claim 1, wherein said cladding layers comprise InP layers of first and second conductivity types whilst said core layers comprise InGaAs layers of said first conductivity type having a lower impurity concentration than said InP layers of said first conductivity type.

4. The semiconductor multilayer Structure as claimed in claim 1, wherein said first conductivity type cladding layers extend from and are unitary formed with a first conductivity type cladding bulk region which extends in a vertical direction to interfaces between said core layers and said cladding layers, and said first conductivity type cladding bulk region is positioned in a first side of a laminated structure of said core layers and said cladding layers, and said first conductivity type cladding bulk region is made of the same compound semiconductor as said first conductivity type cladding layers as well as wherein said second conductivity type cladding layers extend from and are unitary formed with a second conductivity type cladding bulk region which extends in said vertical direction to said interfaces between said core layers and said cladding layers, and said second conductivity type cladding bulk region is positioned in a second side of said laminated structure of said core layers and said cladding layers, and said second conductivity type cladding bulk region is made of the same compound semiconductor as said second conductivity type cladding layers.

5. The semiconductor multilayer structure as claimed in claim 1, wherein each of said core layers consists entirely of a light absorption layer absorbing said light and exhibiting said photoelectric transfer.

6. The compound semiconductor multilayer structure as claimed in claim 2, further comprising:
a compound semiconductor substrate on which said plural core layers and said plural cladding layers are formed.

7. A compound semiconductor multilayer structure comprising:
plural laminations of a photoelectric transfer structure,
each structure having a core layer absorbing light and exhibiting a photoelectric transfer and cladding layers of different conductivity types sandwiching said core layer,
wherein said core layers are separated from each other by said cladding layers.

8. The semiconductor multilayer structure as claimed in claim 7, wherein adjacent two of said cladding layers, which sandwich each of said core layers, are of first and second conductivity types respectively so that first conductivity type carriers generated by said photoelectric transfer move into a first conductivity type one of said cladding layers whilst that second conductivity type carriers generated by said photoelectric transfer move into a second conductivity type one of said cladding layers.

9. The semiconductor multilayer structure as claimed in claim 8, wherein said cladding layers comprise InP of first and second conductivity types respectively and said core layers comprise intrinsic InGaAs.

10. The semiconductor multilayer structure as claimed in claim 8, wherein said cladding layers comprise InP layers of first and second conductivity types respectley and said core layers comprise InGaAs layers of said first conductivity type having a lower impurity concentration than said InP layers of said first conductivity type.

11. The semiconductor multilayer structure as claimed in claim 8, wherein said first conductivity type cladding layers extend from and are unitary formed with a first conductivity type cladding bulk region which extends in a vertical direction to interfaces between said core layers and said cladding layers, and said first conductivity type cladding bulk region is positioned in a first side of a laminated structure of said core layers and said cladding layers, and said first conductivity type cladding bulk region is made of the same compound semiconductor as said first conductivity type cladding layers as well as wherein said second conductivity type cladding layers extend from and are unitary formed with a second conductivity type cladding bulk region which extends in said vertical direction to said interfaces between said core layers and said cladding layers, and second conductivity type cladding bulk region is positioned in a second side of said laminated structure of said core layers and said cladding layers, and said second conductivity type cladding bulk region is made of the same compound semiconductor as said second conductivity type cladding layers.

12. The semiconductor multilayer structure as claimed in claim 7, wherein each of said core layers consists entirely of a light absorption layer absorbing said light and exhibiting said photoelectric transfer.

13. The compound semiconductor multilayer structure as claimed in claim 8, further comprising:
a compound semiconductor substrate on which said plural core layers and said plural cladding layers are formed.

14. A compound semiconductor photodetector comprising:
a compound semiconductor substrate;
alternating lamination of a plurality of core layers absorbing light and exhibiting a photoelectric transfer and a plurality of cladding layers, adjacent two of said cladding layers sandwich each of said core layers so that said core layers are separated from each other by said cladding layers,
wherein adjacent two of said cladding layers sandwiching each of said core layers are of first and second conductivity types respectively so that first conductivity type carriers generated by said photoelectric transfer move into a first conductivity type one of said cladding layers and second conductivity type carriers generated by said photoelectric transfer move into a second conductivity type one of said cladding layers;
a first conductivity type cladding bulk region, from which said first conductivity type cladding layers extend, said first conductivity type cladding bulk region being unitary formed with said first conductivity type cladding layers, said first conductivity type cladding bulk region extending in a vertical direction to interfaces between said core layers and said cladding layers, said first conductivity type cladding bulk region being positioned in a first side of said alternating lamination of said core layers and said cladding layers, and said first conductivity type cladding bulk region being made of the same compound semiconductor as said first conductivity type cladding layers;
a second conductivity type cladding bulk region, from which said second conductivity type cladding layers extend, said second conductivity type cladding bulk region being unitary formed with said second conductivity type cladding layers, said second conductivity type cladding bulk region extending in said vertical direction to said interfaces between said core layers and said cladding layers, said second conductivity type cladding bulk region being positioned in a second side of said alternating laminations of said core layers and said cladding layers, and said second conductivity type cladding bulk region being made of the same compound semiconductor as said second conductivity type cladding layers;
a first electrode in contact with said first conductivity type cladding bulk region; and
a second electrode in contact with said second conductivity type cladding bulk region.

15. The compound semiconductor photodetector as claimed in claim 14, wherein said first and second conductivity type cladding layers and bulk regions comprise InP, and said core layers comprise intrinsic InGaAs.

16. The compound semiconductor photodetector as claimed in claim 14, wherein said first and second conductivity type cladding layers and bulk regions comprise InP, and said core layers comprise InGaAs layers of said first conductivity type having a lower impurity concentration than said InP layers of said first conductivity type.

17. The compound semiconductor photodetector as claimed in claim 14, wherein each of said core layers consists entirely of a light absorption layer absorbing said light and exhibiting said photoelectric transfer.

* * * * *